United States Patent [19]
Gens

[11] Patent Number: 5,343,084
[45] Date of Patent: Aug. 30, 1994

[54] VARIABLE LEVEL PERIODIC EXCITATION CIRCUIT FOR A CAPACITIVE LOAD

[75] Inventor: Marc Gens, Saint Martin D'Uriage, France

[73] Assignee: SGS-Thomson Microelectronics S.A., Gentilly, France

[21] Appl. No.: 875,773

[22] Filed: Apr. 29, 1992

[30] Foreign Application Priority Data

Apr. 30, 1991 [FR] France ................. 91 05774

[51] Int. Cl.$^5$ ................ H03K 17/56; H03K 5/00; H03K 17/687
[52] U.S. Cl. ................... 307/246; 307/572; 307/262
[58] Field of Search ............. 307/246, 270, 572, 262, 307/254

[56] References Cited

U.S. PATENT DOCUMENTS

| 4,214,131 | 7/1980 | Bush et al. | 179/84 T |
| 4,527,133 | 7/1985 | Money | 307/246 |
| 4,658,419 | 4/1987 | Denen | 379/375 |
| 4,733,106 | 3/1988 | Okutani et al. | 307/270 |
| 4,953,070 | 8/1990 | Lenz | 363/58 |
| 5,126,589 | 6/1992 | Renger | 307/246 |

FOREIGN PATENT DOCUMENTS

0299292A2  1/1989  European Pat. Off.
60-117843  6/1985  Japan.

Primary Examiner—Curtis Kuntz
Assistant Examiner—Sinh Tran
Attorney, Agent, or Firm—Lowe, Price, LeBlanc & Becker

[57] ABSTRACT

A predetermined frequency and adjustable level excitation circuit for a capacitive load (B) having a first terminal connected to a reference voltage (G). The circuit includes two switches (S1, S2) connected in series between a supply voltage (Vcc) and the reference voltage (G). The junction (S) of the two switches is coupled to the second terminal (A) of the load. The two switches are not simultaneously closed. A circuit (10) periodically controls the closing of the switch connected to the supply voltage. A regulation circuit (R2, R3, 12) acts on the control circuit to trigger opening of one of the switches when the voltage across the load reaches a predetermined value.

9 Claims, 4 Drawing Sheets

VARIABLE LEVEL PERIODIC EXCITATION CIRCUIT FOR A CAPACITIVE LOAD

TECHNICAL FIELD

The present invention relates to a predetermined frequency and variable level excitation circuit for a capacitive load, such as a piezoelectric buzzer used as a bell in a telephone set.

BACKGROUND ART

Generally, the sound level of a telephone bell is variable. In high-end models, the bell is a loud-speaker fed by a square wave signal of a predetermined frequency (about 1 Khz). The loud-speaker is controlled by an amplifier, the gain of which is programmable by the user by actuating the keys of the telephone set.

In low-end telephone sets, the bell is a piezoelectric buzzer fed by the same square wave signal. Generally, the sound level of the buzzer is fixed by a potentiometer connected in series with the buzzer. In such a low-end set, the installation of a potentiometer is expensive and its use is not convenient. It would be a priori less expensive to adjust the sound level by means of the telephone keys.

However, problems are encountered in achieving a programmable gain amplifier for a piezoelectric buzzer. Indeed, a piezoelectric buzzer is a highly capacitive load liable to cause an instability of the amplifier. The amplifier should be carefully designed and compensated with relatively high value capacitors. Hence, such an amplifier would be much more expensive than the amplifier used for loud-speakers.

It is also not possible to use a pulse width modulation (PWM) amplifier. A piezoelectric buzzer exhibits several resonance peaks at various frequencies. Generally, the buzzer is fed by a rectangular signal having a 50% duty cycle and a frequency close to one of the resonance frequencies. The 50% duty cycle rectangular signal has harmonics of rapidly decreasing amplitude only slightly exciting other resonance peaks. When the duty cycle of the excitation signal is decreased, the amplitudes and the number of harmonics increase and can excite other resonance peaks, which may cause an insufficient variation of the sound level.

SUMMARY OF THE INVENTION

An object of the invention is to achieve a circuit allowing a programmable sound level variation while avoiding the above drawbacks.

This object is achieved by a predetermined frequency and adjustable level excitation circuit for a capacitive load. The load has a first terminal which is connected to a reference voltage. The circuit includes two switches connected in series between a supply voltage and the reference voltage. The junction of the two switches is coupled to the second terminal of the load. The two switches do not simultaneously close. The excitation circuit also includes a circuit for periodically controlling the closing of the switch connected to the supply voltage. A regulator acts on the control circuit to open one of the switches when the voltage across the load reaches a predetermined value.

According to an embodiment of the invention, the control circuit comprises a periodic logic control signal input, a first output controlling one of the switches in phase with the control signal, a second output controlling the other switch in phase opposition to the control signal, and a high impedance setting input. In response to a high impedance setting signal, the switch is opened, at least until the next state transition of the control signal.

According to another embodiment of the invention, the control means comprise a comparator. The output of the comparator is connected to the high impedance setting input of the control circuit. A comparison input of the comparator receives a reference voltage, and the other comparison input is coupled to the second terminal of the load.

According to a further embodiment of the invention, the control circuit comprises, for each switch, a means for detecting the current in the switch, which opens the other switch if the detected current exceeds a predetermined value.

BRIEF DESCRIPTION OF THE DRAWINGS

The foregoing and other objects, features and advantages of the invention will be apparent from the following detailed description of preferred embodiments by referring to the accompanying figures wherein.

DETAILED DESCRIPTION OF THE INVENTION

Figure 1:
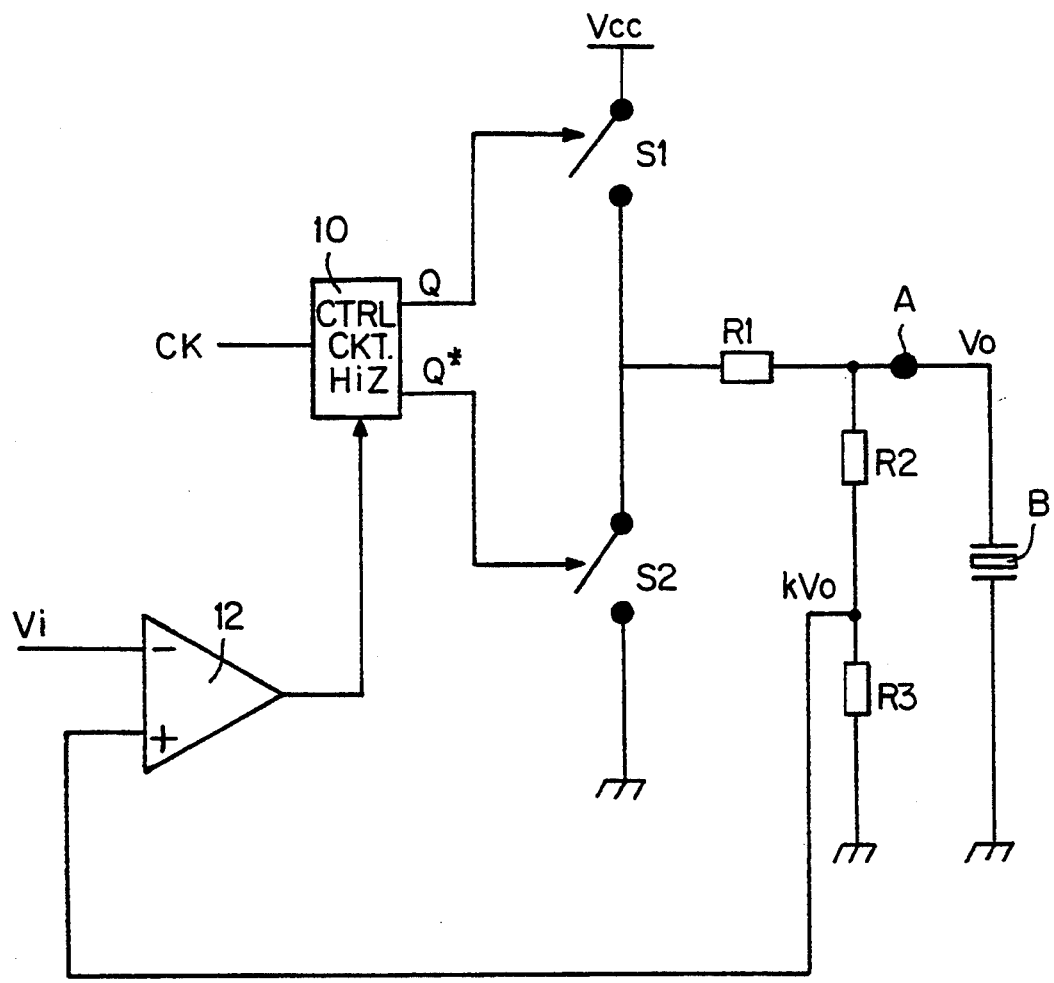
FIG. 1 is a block diagram of an embodiment of the invention.

FIG. 1 shows a piezoelectric buzzer B comprising a terminal connected to ground G and a terminal A connected through a resistor R1 to a junction S. A switch S1 is connected between a supply terminal Vcc and junction S, and a switch S2 is connected between the junction S and ground G. Switches S1 and S2 are respectively controlled by outputs Q and Q* of a control circuit 10. The control circuit 10 comprises an input receiving the buzzer excitation signal CK (a rectangular signal with a 50% duty cycle) and a high impedance setting signal HiZ provided by the output of a comparator 12. The inverting input of comparator 12 receives a reference voltage Vi and the non-inverting input receives the voltage Vo present at the terminal A of the buzzer, divided by a resistive divider R2 and R3. The voltage present on the non-inverting input of the comparator is equal to kVo, where k is the multiplying coefficient (smaller than 1) of the divider R2, R3.

The circuit of FIG. 2 can operate according to two different modes which will be described with reference to FIGS. 2 and 3.

Figures 2A, 2B, 2C:
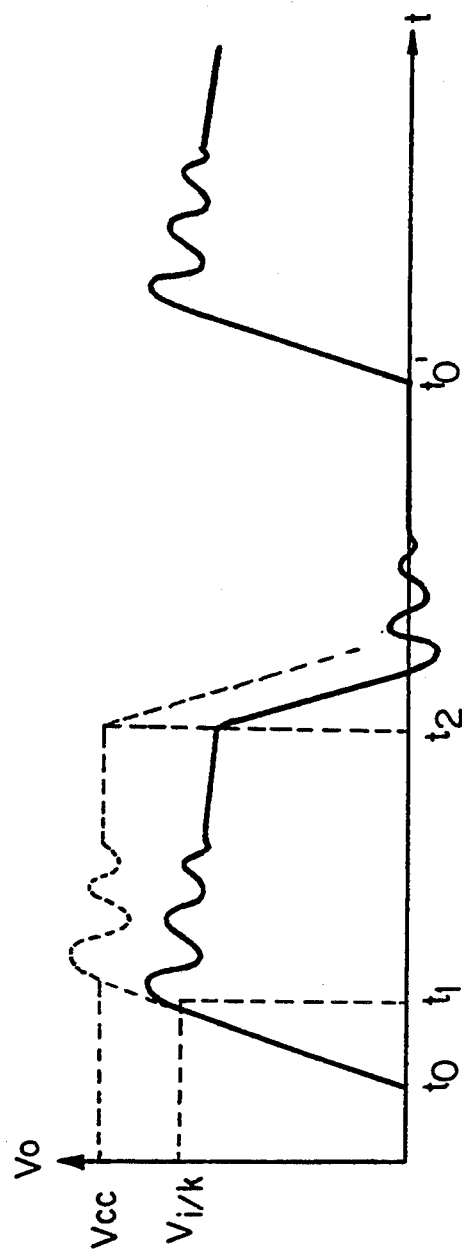
FIGS. 2(a)–(c) show waveforms illustrating an operating mode of the circuit of FIG. 1.

FIG. 2 shows a set of waveforms illustrating a first operating mode of the circuit according to the invention shown in FIG. 1. Waveform (a) illustrates the voltage Vo across the buzzer B as a function of time t and the signals Q and Q* controlling the switches S1 and S2. Waveform (b) illustrates the variation of signal Q as a function of time. A low state of signal Q corresponds to the opening of switch S1, and a high state corresponds to the closing of switch S1. Waveform (c) illustrates the variations of signal Q* as a function of time. A low level of signal Q* corresponds to the opening of switch S2, and a high level corresponds to the closing of switch S2.

The excitation signal CK corresponds to the logic complement of signal Q* and is not shown.

Initially, signal Q is at a low level, and signal Q* at a high level, switch S1 is open, and switch S2 is closed. The voltage Vo across the buzzer is null. At a time $t_o$, the excitation signal CK is provided to circuit 10. Signal Q goes high, switch S1 is closed and switch S2 is opened. Voltage Vo abruptly increases, which corresponds to the loading of the capacitive component of buzzer B through resistor R1. When, at a time $t_1$, voltage Vo reaches Vi/k (when the voltage on the noninverting input of comparator 12 reaches the reference voltage Vi), comparator 12 switches to a state causing switch S1 to be opened by the control circuit 10. Switch S2 remains open. Switch S1 will be maintained open until the next rising edge of signal CK. Voltage Vo stops increasing, exhibits a few oscillations around Vi/k corresponding to the excitation of a second resonance peak of buzzer B, and slowly decreases, which corresponds to the discharging of the capacitance of buzzer B through the divider R2, R3. At a time $t_2$, the excitation signal CK goes low, switch S2 is closed and abruptly discharges the buzzer capacitance through resistor R1. Voltage Vo abruptly drops to zero and exhibits a few oscillations. At a time $t'_0$, the cycle is resumed . . . .

Thus, the amplitude of signal Vo can be adjusted by changing the reference voltage Vi, which corresponds to an adjustment of the sound level of the buzzer. In dashed lines are shown the shapes of voltage Vo and the corresponding signal Q, for a reference voltage Vi such as Vi/k=Vcc. This corresponds to the maximum sound level.

One will note here the difference between this operating mode and a pulse width modulation (PWM) control. Indeed, in the case of a PWM control, complementary signals Q and Q* are used, that is, there is at most a very short phase during which switches S1 and S2 are simultaneously open. On the contrary, according to the invention, switches S1 and S2 are simultaneously open between times $t_1$ and $t_2$.

Figures 3A, 3B, 3C:
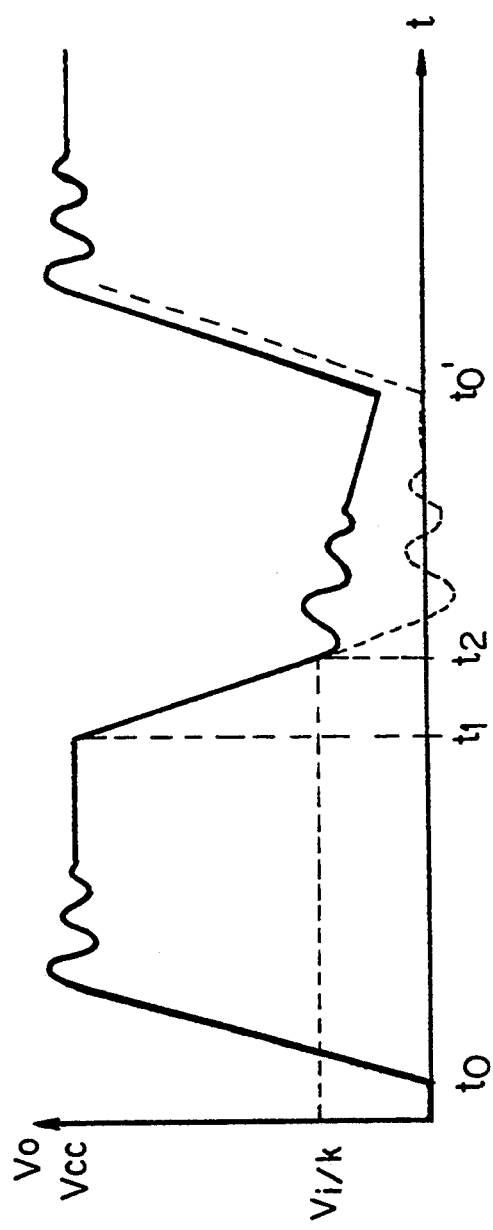
FIGS. 3(a)–(c) show waveforms illustrating another operating mode of the circuit of FIG. 1.

FIG. 3 shows waveforms illustrating another operating mode of the circuit according to the invention. Waveforms (a), (b) and (c) illustrate the same waveforms as in FIG. 2. Here, signal Q is identical to the excitation signal CK.

At an initial time, switch S1 is open, switch S2 is closed, and voltage Vo is null. At a time $t_o$, signal Q (or signal CK) goes high and signal Q* goes low. These states are maintained during the half-period of the square signal CK. Voltage Vo abruptly rises to the value of the supply voltage Vcc, exhibits a few oscillations and stabilizes at Vcc. At a time $t_1$, the half-period of signal CK is reached, switch S1 is opened and switch S2 is closed. Voltage Vo abruptly decreases until a time $t_2$ when it reaches the value Vi/k, and comparator 12 switches causing switch S2 to be opened. Voltage Vo stops its abrupt decrease, exhibits a few oscillations and progressively decreases, which corresponds to the discharge of the buzzer capacitance in the divider R2, R3. The cycle is resumed at a time $t'_0$.

In FIG. 3, the dashed lines show the shapes of the voltage Vo and the corresponding signal Q*, for a reference voltage Vi such that Vi/k=0. These shapes correspond to the maximum sound level of the buzzer. The minimum sound level will be attained for Vi/k=Vcc where Vo will be substantially equal to Vcc.

This operating mode allows a simpler manufacturing of the control circuit 10. Indeed, once voltage Vo has reached Vi/k, voltage Vo remains lower than Vi/k and therefore comparator 12 no longer switches back to its initial state for the remaining half-period of signal CK while maintaining switch S2 open; whereas, in the former operating mode, the control circuit 10 had to be constructed in such a way that switch S1 is not closed again during the half-period of signal CK, because the comparator switched to its initial state practically as soon as value Vi/k was reached.

Figure 4:
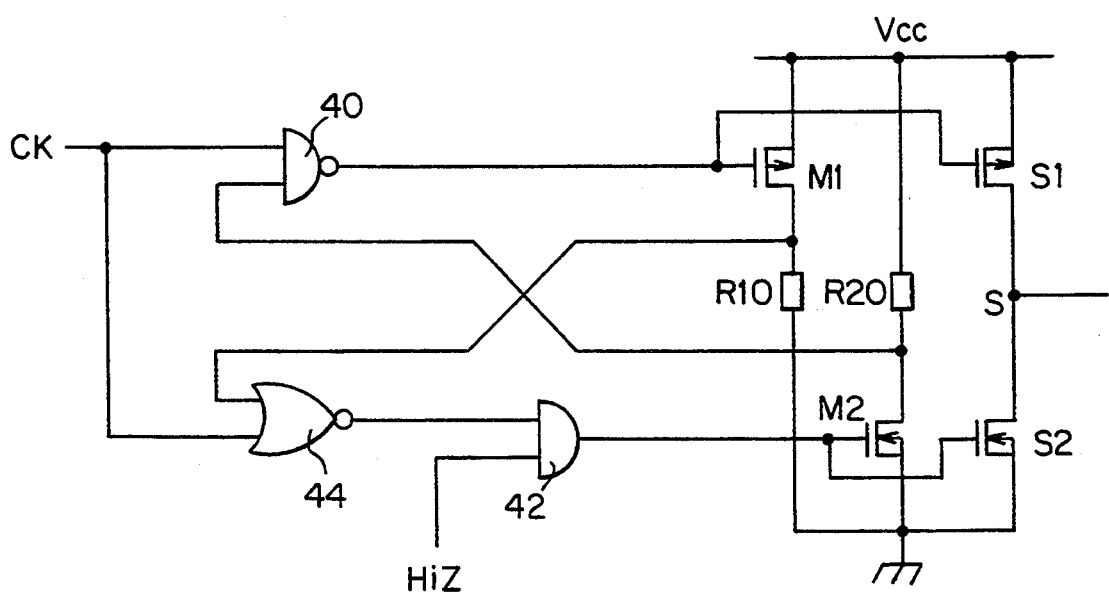
FIG. 4 shows an exemplary embodiment of an element of the circuit of FIG. 1.

FIG. 4 shows a simplified exemplary schematic diagram of the control circuit 10 enabling the operating mode of FIG. 3. Switch S1 is a P-channel MOS transistor, the source of which is connected to the voltage Vcc, the drain of which is connected to the junction S and the gate of which is connected to the output of an NAND gate 40. Switch S2 is an N-channel MOS transistor, the source of which is connected to ground, the drain of which is connected to the junction S and the gate of which is connected to the output of an AND gate 42. A first input of the AND gate 42 receives the signal HiZ provided by the output of comparator 12. The second input of the AND gate 42 is connected to the output of a NOR gate 44. A first input of the NAND gate 40 and of NOR gate 44 receive the excitation signal CK.

In a first step, the other components of the circuit, not yet described, will not be taken into account, and it will be assumed that the second input of the NAND gate 40 is high and the second input of the NOR gate 44 is low. Thus, gates 40 and 44 act as inverters. When signal CK is high, the output of gate 40 is low and the MOS transistor S1 is conductive. The output of gate 44 is also low, then, whatever the state of signal HiZ, the output of gate 42 is low and the MOS transistor S2 is blocked. When the signal CK is low, the output of gate 40 is high and transistor S1 is blocked. The output of gate 44 is high and the output of gate 42 is high only if signal HiZ is high, which is the case when Vo>Vi/k. Then, transistor S2 is conductive. If Vo<Vi/k, the output of gate 42 is low and transistor S2 is blocked.

The circuit described above presents a drawback. At time $t_1$, and possibly at time $t'_0$ (FIG. 3), switches S1 and S2 can be simultaneously closed for a very short time, due to slow switching speeds. Since transistors S1 and S2 have to be designed to bear the relatively high excitation currents of the buzzer B, the current flowing through them during the time when they are simultaneously closed can be very high and may damage the transistors. The components of the control circuit according to the invention, as described below, overcome this drawback.

A P-channel MOS transistor M1, of a smaller size than transistor S1, is connected in parallel to the source and gate of transistor S1. The drain of transistor M1 is connected to ground through a resistor R10 and connected to the second input of the NOR gate 44. An N-channel MOS transistor M2, of smaller size than transistor S2, is connected in parallel to the source and gate of transistor S2. The drain of transistor M2 is connected to the supply voltage Vcc through a resistor R20 and to the second input of the NOR gate 40. With this configuration, the current in transistor M1 is proportional to the current in transistor S1, and the current in transistor M2 is proportional to the current in transistor S2. These currents are converted to voltages across resistors R10 and R20. Resistor R10 is selected so that the voltage across it is equal to the threshold voltage of gate 44 when the current in transistor S1 reaches a limit value. Similarly, resistor R20 is selected so that the voltage across transistor M2 reaches the threshold voltage of gate 40 when the current in transistor S2 reaches the limit value.

Thus, when the current in transistor S1 exceeds the limit value, the voltage across resistor R10 corresponds to a logic high level and the output of gate 44 is then forced low, which causes transistor S2 to be blocked. Similarly, if the current in transistor S2 exceeds the limit value, the voltage across resistor R20 is such that the drain/source voltage of transistor M2 corresponds to a logic low level, the output of gate 40 is thus forced high, which causes transistor S1 to be blocked. In fact, this limiting device operates in linear mode, which consequently causes the current in transistors S1 and S2 to be regulated to the limit value when both transistors are simultaneously conductive.

The circuits according to the invention are particularly fast if they are achieved in bipolar MOS (BIP-MOS) technology.

The invention has been described in connection with the excitation of a piezoelectric buzzer, but it can be applied to the excitation of any capacitive load. Many variants and modifications of the invention will appear to those skilled in the art, especially as regards the various possibilities of achieving the control circuit 10.

Although they have not been described above, those skilled in the art will note that many circuits are known for adjusting the reference voltage Vi by actuation of the telephone keys.

What is claimed is:

1. A predetermined frequency and adjustable level excitation circuit for a capacitive load having a first terminal connected to a first supply voltage, said predetermined frequency and adjustable level excitation circuit comprising:
   two switches connected in series between a second supply voltage and said first supply voltage, a junction of said two switches being coupled to a second terminal of the load, said two switches not being simultaneously closed;
   a control circuit for periodically controlling the operation of the two switches, wherein said control circuit comprises:
   (a) a periodic logic control signal input,
   (b) a first output controlling a first of the switches in phase with the periodic logic control signal,
   (c) a second output controlling the other switch in phase opposition to the periodic logic control signal,
   (d) a high impedance setting input for receiving a high impedance setting signal,
   (e) means responsive to said high impedance setting signal for causing one of the switches to be opened at least until a next state transition of the control signal, and
   (f) for each switch, a means for detecting current in the switch and opening the other of said switches if the current exceeds a predetermined value; and
   regulation means for triggering the control circuit to open said one of the switches when a voltage across the load reaches a predetermined value.

2. An excitation circuit according to claim 1, wherein:
   the regulation means comprises a comparator, an output of said comparator being connected to said high impedance setting input of the control circuit; and
   a comparison input of said comparator receives a reference voltage, and another comparison input of said comparator is coupled to the second terminal of the load.

3. An excitation circuit as in claim 1, wherein the predetermined value is adjustable to adjust the excitation level provided to said capacitive load.

4. A circuit as in claim 1, wherein the capacitive load is a piezoelectric buzzer.

5. A circuit as in claim 4, wherein the piezoelectric buzzer serves as the ringer of a telephone set.

6. A circuit comprising:
   a first switch connected between one line of a supply voltage and a junction point;
   a second switch connected between said junction point and a second line of the supply voltage;
   a capacitive load coupled between the junction point and the second line of the supply voltage;
   a control circuit, responsive to a clock signal, for controlling the opening and closing of said first and second switches such that the first and second switches are not closed simultaneously and such that said first switch closes periodically at a predetermined frequency; and
   regulation means for detecting when the voltage across the capacitive load falls from supply voltage to a predetermined value; wherein
   said control circuit comprises means, responsive to the detection of the voltage across the load falling to the predetermined value by said regulation means, for opening the second switch.

7. An circuit as in claim 6, wherein the predetermined value is adjustable to adjust the excitation level provided to said capacitive load.

8. A method of exciting a capacitive load at a predetermined frequency and an adjustable excitation level, comprising the steps of:
   periodically closing a first switch connected to a supply voltage, and simultaneously opening a second switch connected to ground, to periodically couple the capacitive load to the supply voltage and charge the capacitive load;
   periodically opening the first switch and simultaneously closing the second, to periodically couple the capacitive load to the ground to discharge the capacitive load;
   detecting the voltage across the capacitive load;
   in response to the voltage detection, when the voltage across the capacitive load reaches a predetermined value during discharging of the capacitive load, opening said second switch to reduce discharging of said capacitive load; and
   adjusting the predetermined value to adjust the excitation level applied to the capacitive load.

9. A method of excitation as in claim 8, wherein the capacitive load is a piezoelectric buzzer.

* * * * *